United States Patent
Tsunehara et al.

(10) Patent No.: US 8,413,030 B2
(45) Date of Patent: Apr. 2, 2013

(54) WIRELESS COMMUNICATION SYSTEM, RECEIVER AND SIGNAL PROCESSING METHOD FOR RECEIVED SIGNAL

(75) Inventors: Katsuhiko Tsunehara, Hachioji (JP); Yunjian Jia, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 908 days.

(21) Appl. No.: 12/473,427

(22) Filed: May 28, 2009

(65) Prior Publication Data

US 2009/0307567 A1    Dec. 10, 2009

(30) Foreign Application Priority Data

Jun. 5, 2008 (JP) ................. 2008-148277

(51) Int. Cl.
*H03M 13/03* (2006.01)
(52) U.S. Cl. ...................................... 714/794
(58) Field of Classification Search .............. 714/794
See application file for complete search history.

(56) References Cited

U.S. PATENT DOCUMENTS

| | | | |
|---|---|---|---|
| 6,389,574 B1 * | 5/2002 | Belveze et al. | 714/795 |
| 6,625,236 B1 * | 9/2003 | Dent et al. | 375/341 |
| 7,337,385 B2 * | 2/2008 | Harada | 714/781 |
| 2005/0007947 A1 | 1/2005 | Abe et al. | |
| 2007/0121742 A1 | 5/2007 | Tamaki et al. | |
| 2012/0275416 A1 * | 11/2012 | Yokoyama | 370/329 |

FOREIGN PATENT DOCUMENTS

| | | |
|---|---|---|
| JP | 2003-283462 A | 10/2003 |
| JP | 2004-32125 A | 1/2004 |
| JP | 2004-032712 A | 1/2004 |
| JP | 2007-135021 A | 5/2007 |
| JP | 2008-017144 A | 1/2008 |
| WO | 2009/093332 A1 | 7/2009 |

\* cited by examiner

*Primary Examiner* — Albert Decady
*Assistant Examiner* — Enam Ahmed
(74) *Attorney, Agent, or Firm* — Mattingly & Malur, PC

(57) ABSTRACT

The error correction capability for wireless communication carried out involving propagation path fluctuation in time and frequency selectivity can be improved. A soft decision likelihood value inputted to an error correction decoder is multiplied by a weight determined according to the distance between the data symbol and pilot symbol corresponding to the soft decision likelihood value. Namely, the soft decision bit likelihood value corresponding to the data symbol is weighted according to the distances in time or frequency between the pilot symbol and data symbol. The weight is made smaller when the distance in time or frequency is larger.

11 Claims, 12 Drawing Sheets

WIRELESS COMMUNICATION SYSTEM, RECEIVER AND SIGNAL PROCESSING METHOD FOR RECEIVED SIGNAL

CLAIM OF PRIORITY

The present application claims priority from Japanese patent application JP 2008-148277 filed on Jun. 5, 2008, the content of which is hereby incorporated by reference into this application.

BACKGROUND OF THE INVENTION (1) Field of the Invention

The present invention relates to a signal processing method applied, in a wireless communication system, to signals from a transmitter received by a receiver and, more particularly, to a receiver included in a wireless communication system for mobile communication using an error correction code.

(2) Description of the Related Arts

With mobile communication services offering growing communication speed, wireless communication systems are required to achieve improved frequency efficiency enabling faster wireless communications in a narrower bandwidth.

Using an error correction code is a technique for improving frequency efficiency. Convolution codes and turbo codes are among the error correction codes used for digital data transmissions. An example configuration and an example operation of an existing type of receiver included in a wireless communication system will be described below with reference to FIGS. 8 and 9. FIG. 8 is a block diagram of the configuration of an existing type of receiver. FIG. 9 is a diagram for explaining relationships between received symbols, propagation path estimation results, and soft decision likelihoods associated with an existing type of receiver. In FIG. 8, reference numeral 100 denotes an antenna; 101 a signal receiver; 102 a pilot symbol selector; 103 a propagation path estimator; 104 a propagation path correction part; 105 a demapping part; 106 an error correction decoder; and 200 to 206, 210 and 211 signal lines.

Referring to FIG. 8, a radio signal received at the antenna 100 is inputted to the signal receiver 101. The signal receiver 101 converts the inputted signal into a received baseband signal by processing it at a radio frequency and an intermediate frequency. Also in the signal receiver 101, the received baseband signal is subjected to analog-to-digital conversion. And the digitized received baseband signal is then outputted to the pilot symbol selector 102 via the signal line 200.

The pilot symbol selector 102 separates received pilot symbols and data symbols from the received baseband signal, then outputs the received pilot symbols to the propagation path estimator 103 via the signal line 201 and the received data symbols to the propagation path correction part 104 via the signal line 202.

In the case of the example received baseband signal shown in FIG. 9, out of symbols 0 to 9, the hatched symbols 2 and 7 are received pilot symbols and the other ones are received data symbols. In this case, therefore, the pilot symbol selector 102 outputs, out of the inputted symbols 0 to 9, symbols 2 and 7 to the signal line 201 and symbols 0, 1, 3 to 6, 8, and 9 to the signal line 202.

The propagation path estimator 103 estimates, using the received pilot symbols inputted from the pilot symbol selector 102 and reference pilot symbols predetermined in the system, radio signal propagation paths between a transmitter (not shown) and the receiver. The propagation path $H_P$ corresponding to a pilot symbol is estimated, for example, using equation (1) where $R_P$ represents the received pilot symbol and $A_P$ represents a reference pilot symbol. The $H_P$, $R_P$, and $A_P$ are complex numbers. In the example shown in FIG. 9, $H_2$ and $H_7$ represent propagation path estimation results corresponding to pilot symbols 2 and 7, respectively.

$$H_P = \frac{R_P}{A_P} \quad (1)$$

Subsequently, the propagation path estimator 103 estimates a propagation path $H_D$ corresponding to each data symbol based on the propagation path $H_P$ corresponding to each pilot symbol estimated using equation (1). In the example shown in FIG. 9, $H_0$, $H_1$, $H_3$ to $H_6$, $H_8$, and $H_9$ represent propagation path estimation results corresponding to the received data symbols 0, 1, 3 to 6, 8, and 9, respectively. The propagation path estimation results $H_0$, $H_1$, $H_3$ to $H_6$, $H_8$, and $H_9$ corresponding to the received data symbols are obtained by applying linear interpolation, for example, as expressed in equation (2).

$$H_{Dn} = \frac{H_7 - H_2}{7 - 2}(n - 2) + H_2 \quad (2)$$
$$(n = 0, 1 \ldots 9)$$

The propagation path estimator 103 outputs the propagation path estimation results obtained by the above method to the propagation path correction part 104 via the signal line 203.

The propagation path correction part 104 corrects, using the propagation path estimation results inputted from the propagation path estimator 103, effects of propagation paths which have been inflicted on the received data symbols inputted from the pilot symbol selector 102. To do so, the propagation path correction part 104 uses, for example, equation (3).

$$E_d = \frac{R_d}{H_d} \quad (3)$$

In equation (3), Rd is a received data symbol, Hd is a propagation path estimation result corresponding to the received data symbol Rd, and Ed is a received data symbol with the effects thereon of the propagation path corrected. The propagation path correction part 104 outputs the data symbol Ed with the effects thereon of the propagation path corrected to the demapping part 105 via the signal line 204.

The demapping part 105 converts, in accordance with a predetermined mapping rule, the received data symbol Ed inputted from the propagation path correction part 104 into a soft decision bit likelihood. An example method of converting a received data symbol into a soft decision bit likelihood will be explained with reference to FIG. 10. FIG. 10 is a diagram for explaining a method of converting a received data symbol into a soft decision bit likelihood using Binary Phase Shift Keying (BPSK) as a mapping rule. It shows a relationship between a reference signal point and a received signal point.

Referring to FIG. 10, symbol points 300 and 301 positioned at I-axis coordinate −A and +A, respectively, are used as reference symbol points in converting symbol data into a soft decision bit likelihood. It is assumed that symbol points 300 and 301 correspond to bit values 1 and 0, respectively.

Received data symbol point 302 represents a received data symbol inputted from the propagation path correction part 104 to the demapping part 105. It is positioned at I-axis coordinate X. The demapping part 105 converts the received data symbol 302 into soft decision bit likelihood L using equation (4) where $\sigma^2$ represents a noise power of additive white Gaussian noise assumed for this case.

$$L = \frac{4AX}{2\sigma^2} \quad (4)$$

Soft decision bit likelihood outputs $L_0$, $L_1$, $L_3$ to $L_6$, $L_8$, and $L_9$ shown in FIG. 9 correspond to received data symbols 0, 1, 3 to 6, 8, and 9, respectively.

The operation of the demapping part 105 has been explained above based on an example case in which BPSK is applied as a mapping rule. The demapping part 105 can operate in a similar manner also in cases where Quadrature Phase Shift Keying (QPSK) or 16 Quadrature Amplitude Modulation (16QAM) is applied as a mapping rule for multilevel modulation. In such cases, the method disclosed in JP-A No. 2004-032125 may be used.

In cases where QPSK or 16QAM is applied as a mapping rule for multilevel modulation, each soft decision bit likelihood output is assumed to include two or more bit likelihoods. When, for example, QPSK is applied as a mapping rule, each soft decision bit likelihood output $L_n$ includes two likelihood values $L_{n0}$ and $L_{n1}$.

The demapping part 105 outputs the soft decision bit likelihoods calculated as described above to the error correction decoder 106 via the signal line 205.

The error correction decoder 106 performs error correction decoding in a predetermined way using soft decision bit likelihoods $L_0$, $L_1$, $L_3$ to $L_6$, $L_8$, and $L_9$ inputted from the demapping part 105. For example, turbo decoding is performed for error correction decoding. The error correction decoder 106 outputs a decoded bit string obtained as a result of error correction decoding via the signal line 206.

The existing type of receiver shown in FIG. 8 can obtain a decoded bit string by processing a received signal for error correction decoding as described above.

A problem which the present invention aims at solving will be explained with reference to FIGS. 9 and 11. FIG. 11 is a diagram showing relationships between true and estimated propagation-path values on an I-Q plane.

In FIG. 11, the propagation path fluctuation with time is represented by a curve 400 plotted on a complex I-Q plane. Points 401 and 402 also plotted on the complex I-Q plane represent the propagation path estimation results $H_2$ and $H_7$ obtained using the received pilot symbols 2 and 7 shown in FIG. 9. Points 403 and 404 also potted on the complex I-Q plane represent true propagation-path values corresponding to the received data symbols 3 and 4 shown in FIG. 9, respectively.

Assume a case in which propagation paths corresponding to the received data symbols 3 and 4 are estimated using equation (2) for linear interpolation. Propagation path estimation results H3 and H4 corresponding to the received data symbols 3 and 4 shown in FIG. 9 can be represented, in FIG. 11, by points 406 and 407 on a straight line 405 connecting points 401 and 402 on the I-Q plane.

Next, consider the received data symbol 3 shown in FIG. 9. The error included in the propagation path estimation result corresponding to the received data symbol 3 is represented by an error vector 410 between point 403 representing the true propagation-path value and point 406 representing a propagation path estimation result. Similarly, the error included in the propagation path estimation result corresponding to the received data symbol 4 is represented by an error vector 411 between points 404 and 407.

The error vector 411 is longer than the error vector 410. Namely, the error included in the propagation path estimation result represented by point 407 is larger than that included in the propagation path estimation result represented by point 406.

Generally, a propagation path changes continuously as represented by the curve 400 shown in FIG. 11. Therefore, when propagation paths corresponding to data symbols are estimated using propagation path estimation results obtained using received pilot symbols, errors included in propagation path estimation results corresponding to data symbols closer to pilot symbols are considered smaller than errors included in propagation path estimation results corresponding to data symbols farther from pilot symbols.

As stated above in describing the operation of an existing type of receiver, soft decision bit likelihoods used for error correction decoding are calculated using propagation path estimation results. Namely, the magnitudes of errors included in propagation path estimation results correspond to the magnitudes of errors included in soft decision bit likelihoods.

Hence, errors included in soft decision bit likelihoods corresponding to data symbols closer to pilot symbols are considered smaller than errors included in soft decision bit likelihoods corresponding to data symbols farther from pilot symbols.

When signals are processed in existing types of receivers and transmitters, however, all soft decision bit likelihoods are treated equally without any consideration given to the magnitudes of errors included in them. In error correction decoding, therefore, the reliability of error correction is considered unfavorably affected by soft decision bit likelihoods including large errors. This results in degrading the system performance, lowering the communication quality and frequency efficiency of the system.

The above description of related arts has covered a problem of propagation path fluctuation with time. A similar problem is caused also by propagation path fluctuation with frequency attributable to the frequency selective for multipaths.

A method of solving such problems is disclosed in JP-A No. 2007-135021. In the method, an important signal for error correction decoding is provided for a symbol positioned closely to a pilot symbol so as to improve the communication quality. The method, however, relates to transmission processing according to a communication method, so that it is not easily applicable to a wireless communication system using an already established communication method.

SUMMARY OF THE INVENTION

In view of the problem as described above, the present invention provides a wireless communication system, a receiver, and a signal processing method for received signals which can cope with propagation path fluctuation with time and frequency.

According to the present invention, a soft decision bit likelihood value corresponding to a data symbol is weighted according to the distance in time or frequency between the data symbol and a corresponding pilot symbol. The weighting is smaller when the distance is larger.

The wireless communication system for communicating a radio signal according to the present invention has a transmitter for transmitting a radio signal and a receiver for receiving the radio signal. The transmitter includes a signal transmitter for transmitting a radio signal to the receiver. The receiver includes: a signal receiver for receiving a radio signal and processing the radio signal into a received signal; a pilot signal selector for separating a pilot signal from the received signal; a propagation path estimation part for estimating information on a radio signal propagation path using the pilot signal selected by the pilot signal selector; a propagation path correction part for correcting an effect of the propagation path using the propagation path information estimated by the propagation path estimation part, the effect being contained in the received signal; a demapping part for calculating a soft decision likelihood value by comparing the received signal having had the effect thereon of the propagation path corrected at the propagation path correction part and a reference signal, the soft decision likelihood value representing correctness, estimated from the received signal having had the effect thereon of the propagation path corrected, of the signal transmitted from the signal transmitter; a soft decision likelihood weighting part for calculating a weight according to a relationship between the pilot signal and the received signal and multiplying the soft decision likelihood value corresponding to the received signal by the weight; and an error correction decoder for performing error correction decoding using the soft decision likelihood value multiplied by the weight.

In another aspect of the present invention, the wireless communication system further has a propagation path fluctuation measuring part for calculating, using the estimated propagation path information, a quantity of fluctuation of the propagation path information. In the wireless communication system: the soft decision likelihood weighting part calculates a weight according to a relationship between the pilot signal and the received signal and the quantity of fluctuation of the propagation path information, and multiplies the soft decision likelihood value corresponding to the received signal by the weight; and the error correction decoder performs error correction decoding using the soft decision likelihood value multiplied by the weight.

The receiver according to the present invention includes: a signal receiver for receiving a radio signal and processing the radio signal into a received signal; a pilot signal selector for separating a pilot signal from the received signal; a propagation path estimation part for estimating information on a radio signal propagation path using the pilot signal selected by the pilot signal selector; a propagation path correction part for correcting an effect of the propagation path using the propagation path information estimated by the propagation path estimation part, the effect being contained in the received signal; a demapping part for calculating a soft decision likelihood value by comparing the received signal having had the effect thereon of the propagation path corrected at the propagation path correction part and a reference signal, the soft decision likelihood value representing correctness, estimated from the received signal having had the effect thereon of the propagation path corrected, of the signal transmitted from the signal transmitter; a soft decision likelihood weighting part for calculating a weight according to a relationship between the pilot signal and the received signal and multiplying the soft decision likelihood value corresponding to the received signal by the weight; and an error correction decoder for performing error correction decoding using the soft decision likelihood value multiplied by the weight.

In another aspect of the present invention, the receiver further includes a propagation path fluctuation measuring part for calculating, using the estimated propagation path information, a quantity of fluctuation of the propagation path information. In the receiver: the soft decision likelihood weighting part calculates a weight according to a relationship between the pilot signal and the received signal and the quantity of fluctuation of the propagation path information, and multiplies the soft decision likelihood value corresponding to the received signal by the weight; and the error correction decoder performs error correction decoding using the soft decision likelihood value multiplied by the weight.

In another aspect of the present invention, the soft decision likelihood weighting part included in the receiver calculates the weight according to a difference in time between the pilot signal and the received signal.

In another aspect of the present invention, the soft decision likelihood weighting part included in the receiver makes the weight corresponding to the received signal smaller when the difference in time between the pilot signal and the received signal is larger.

In another aspect of the present invention, the soft decision likelihood weighting part included in the receiver calculates the weight according to a difference in frequency between the pilot signal and the received signal.

In another aspect of the present invention, the soft decision likelihood weighting part included in the receiver makes the weight corresponding to the received signal smaller when the difference in frequency between the pilot signal and the received signal is larger.

In another aspect of the present invention, the soft decision likelihood weighting part included in the receiver makes the difference between the weight and another weight larger when the quantity of fluctuation of the propagation path information is larger and makes the difference smaller when the quantity of fluctuation is smaller.

The method of processing a received signal according to the present invention includes: receiving a radio signal and processing the radio signal into a received signal; separating a pilot signal from the received signal and estimating information on a radio signal propagation path using the separated pilot signal; correcting an effect of the propagation path using the estimated propagation path information, the effect being contained in the received signal; calculating a soft decision likelihood value by comparing the received signal having had the effect thereon of the propagation path corrected and a reference signal, the soft decision likelihood value representing correctness, estimated from the received signal having had the effect thereon of the propagation path corrected, of the signal transmitted from the signal transmitter; calculating a weight according to a relationship between the pilot signal and the received signal; multiplying the soft decision likelihood value corresponding to the received signal by the weight; and performing error correction decoding using the soft decision likelihood value multiplied by the weight.

In another aspect of the present invention, the method of processing a received signal further includes: calculating, using the estimated propagation path information, a quantity of fluctuation of the propagation path information; calculating a weight according to a relationship between the pilot signal and the received signal and the quantity of fluctuation of the propagation path information; multiplying the soft decision likelihood value corresponding to the received signal by the weight; and performing error correction decoding using the soft decision likelihood value multiplied by the weight.

According to the present invention, the error rate characteristic of wireless communication can be improved, the speed of wireless communication can be increased, and the frequency efficiency of a wireless communication system can be enhanced.

DETAILED DESCRIPTION OF THE ILLUSTRATED EMBODIMENTS

Figure 1:
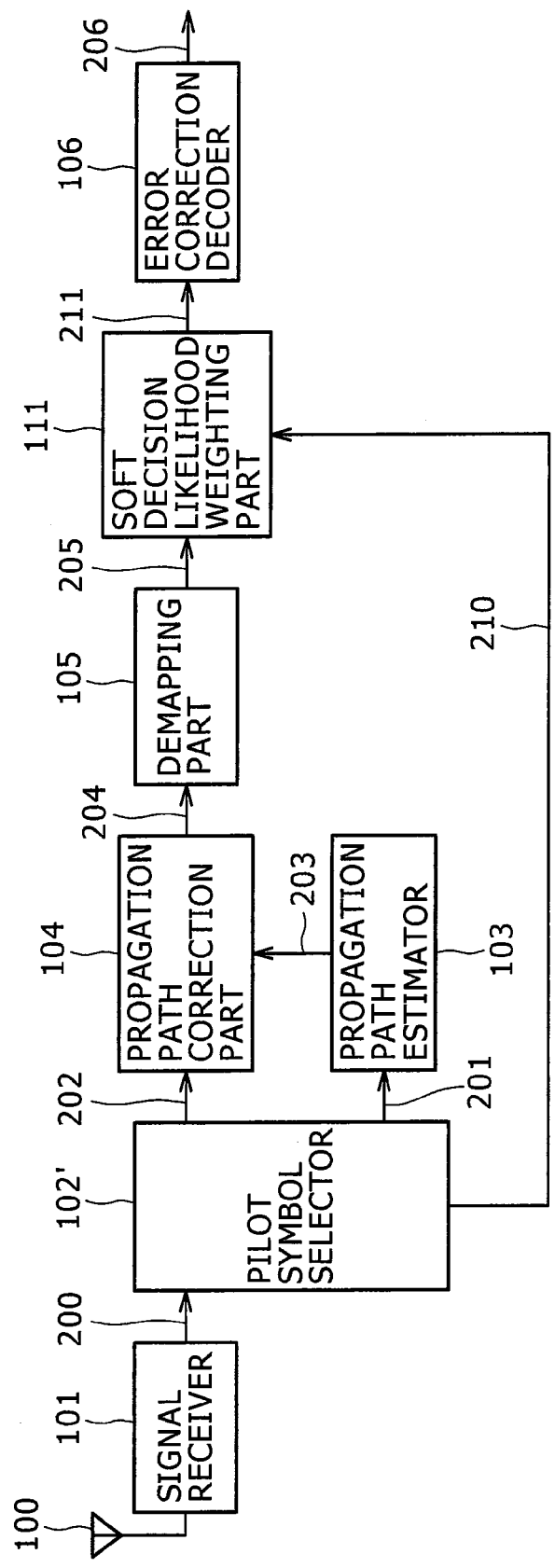
FIG. 1 is a block diagram showing the configuration of a first embodiment of the receiver according to the present invention.

Embodiments of the present invention will be described in detail below with reference to the attached drawings. In the attached drawings including those already referred to in the foregoing, elements having identical functions are denoted by identical reference numerals to avoid descriptive duplication where appropriate.

Embodiment 1

Figure 8:
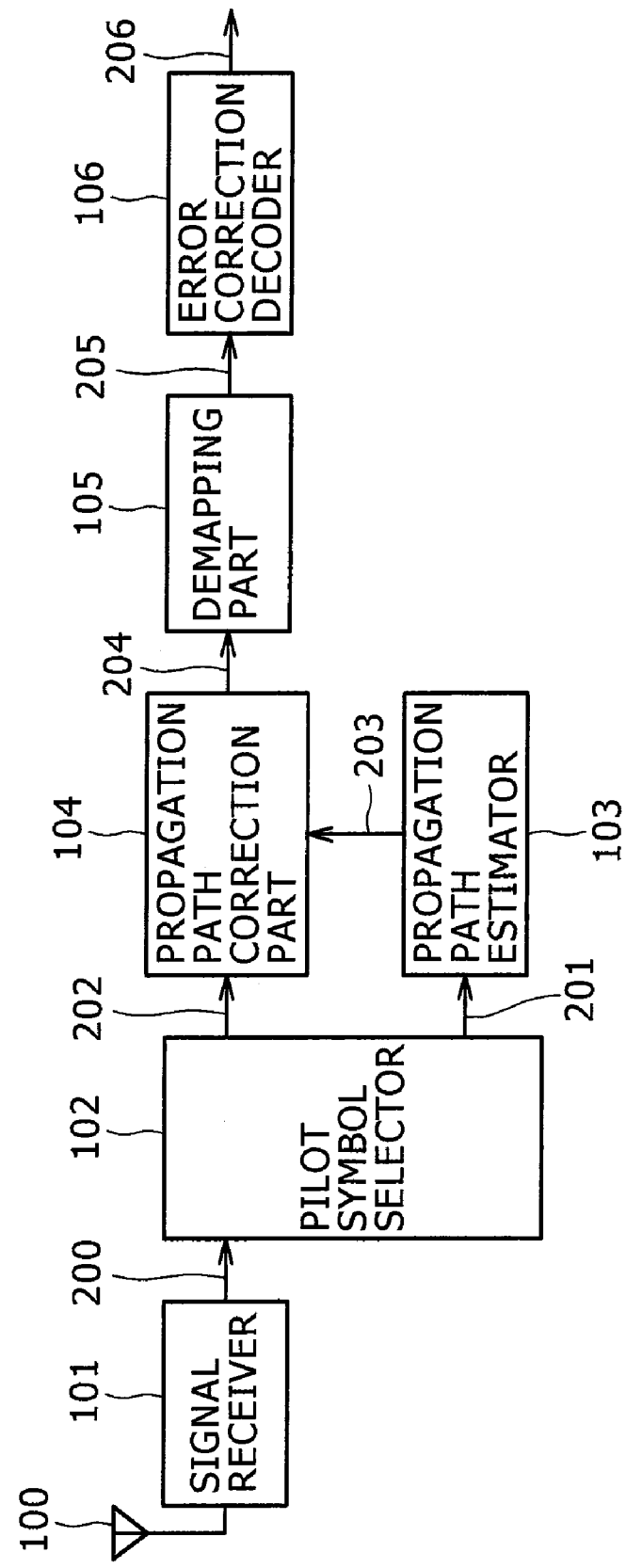
FIG. 8 is a block diagram of the configuration of an existing type of receiver.

FIG. 1 is a block diagram showing the configuration of a first embodiment of the receiver according to the present invention. In FIG. 1, elements whose functions are identical to those of elements shown in FIG. 8 showing the configuration of an existing type of receiver are denoted by the same reference numerals as those denoting the identical elements in FIG. 8. Compared with the receiver whose configuration is shown in FIG. 8, the receiver whose configuration is shown in FIG. 1 has a pilot symbol selector 102' instead of 102; a soft decision likelihood weighting part 111 and a signal line 211 which are added between the demapping part 105/the signal line 205 and the error correction decoder 106; and a signal line 210 connecting the pilot symbol selector 102' and the soft decision likelihood part 111.

Referring to FIG. 1, when a soft decision likelihood is calculated, the demapping part 105 outputs it to the soft decision weighting part 111 via the signal line 205. The soft decision weighting part 111 weights the inputted soft decision likelihood according to the position of the pilot symbol inputted from the pilot symbol selector 102' via the signal line 210.

Figure 2:
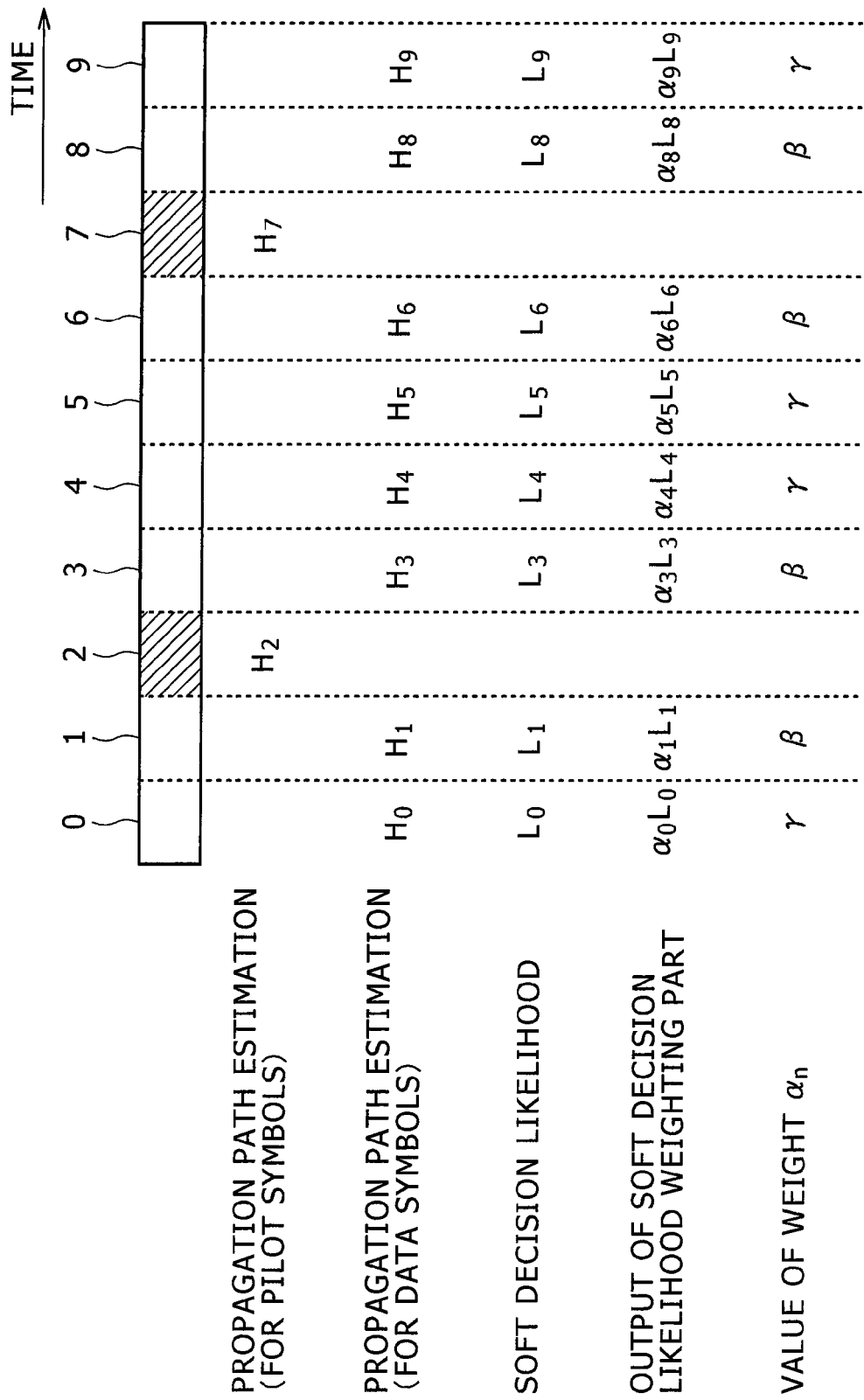
FIG. 2 is a diagram for explaining relationships between received symbols, propagation path estimation results, soft decision likelihoods, outputs of a soft decision likelihood weighting part, and weight values associated with the first embodiment of the present invention.
Figure 9:
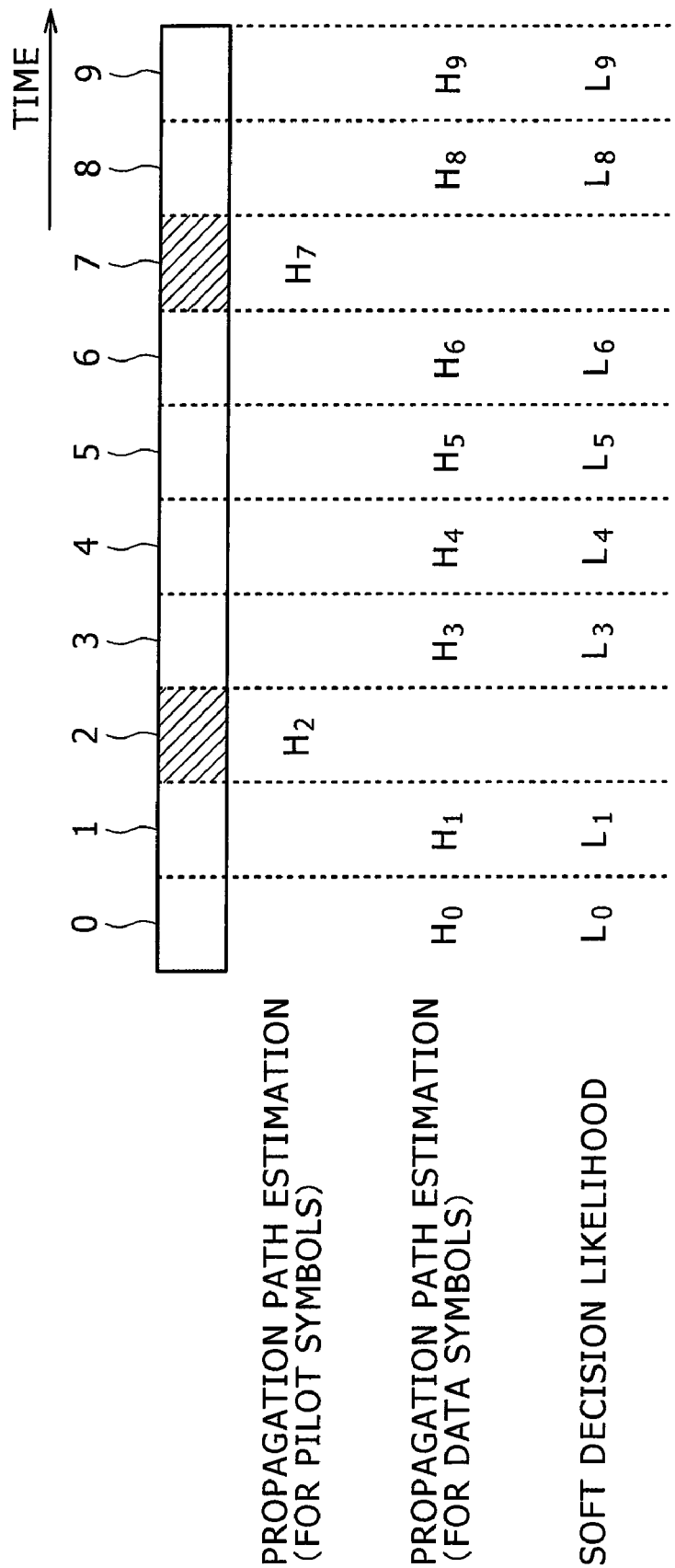
FIG. 9 is a diagram for explaining relationships between received symbols, propagation path estimation results, and soft decision likelihoods associated with an existing type of receiver.
Figure 10:
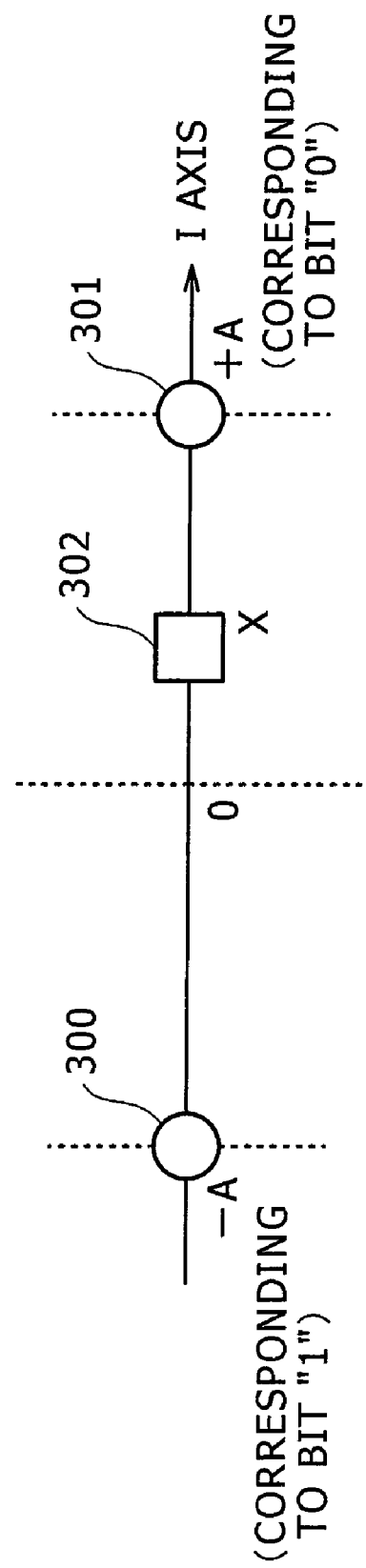
FIG. 10 is a diagram for explaining a method of converting a received data symbol into a soft decision bit likelihood using BPSK as a mapping rule.

The operation of the soft decision likelihood weighting part 111 will be described with reference to FIG. 2. FIG. 2 corresponding to FIG. 9 for an existing type of receiver is a diagram for explaining relationships between received symbols, propagation path estimation results, soft decision likelihoods, outputs of the soft decision likelihood weighting part, and weight values associated with the first embodiment of the receiver according to the present invention.

Referring to FIG. 2, the soft decision likelihood weighting part 111 multiplies inputted soft decision likelihoods $L_0$ to $L_9$ by corresponding weights $\alpha_0$ to $\alpha_9$ and outputs weighted soft decision likelihoods $\alpha_0 L_0$ to $\alpha_9 L_9$. The value of weight $\alpha_n$ (n=0, 1, . . . , 9) is determined according to the difference in time between corresponding received data symbols and received pilot symbols. The value of weight $\alpha_n$ is smaller when the difference in time between the corresponding data symbol and pilot symbol is larger.

In the example shown in FIG. 2, the weights corresponding to data symbols 1, 3, 6 and 8 which are adjacent to pilot symbol 2 or 7 are each represented by $\beta$, and the weights corresponding to other data symbols 0, 4, 5 and 9 are each represented by $\gamma$. Both $\beta$ and $\gamma$ assume non-negative values with $\beta$ being larger than $\gamma$, i.e. $\gamma < \beta$. The values of $\beta$ and $\gamma$ are dependent on communication system specifications and communication environment. In a general mobile communication environment, $\beta$ may be 1, and $\gamma$ may be 0.5. Even though in the example shown in FIG. 2, only two weight values $\beta$ and $\gamma$ are used, three or more weight values may be used.

The soft decision likelihood weighting part 111 outputs the soft decision likelihood values weighted as described above to the error correction decoder 106 via the signal line 211. The error correction decoder 106 performs error correction decoding using the inputted soft decision likelihood values in the same manner as done by the existing type of receiver whose configuration is shown in FIG. 8.

Figure 12:
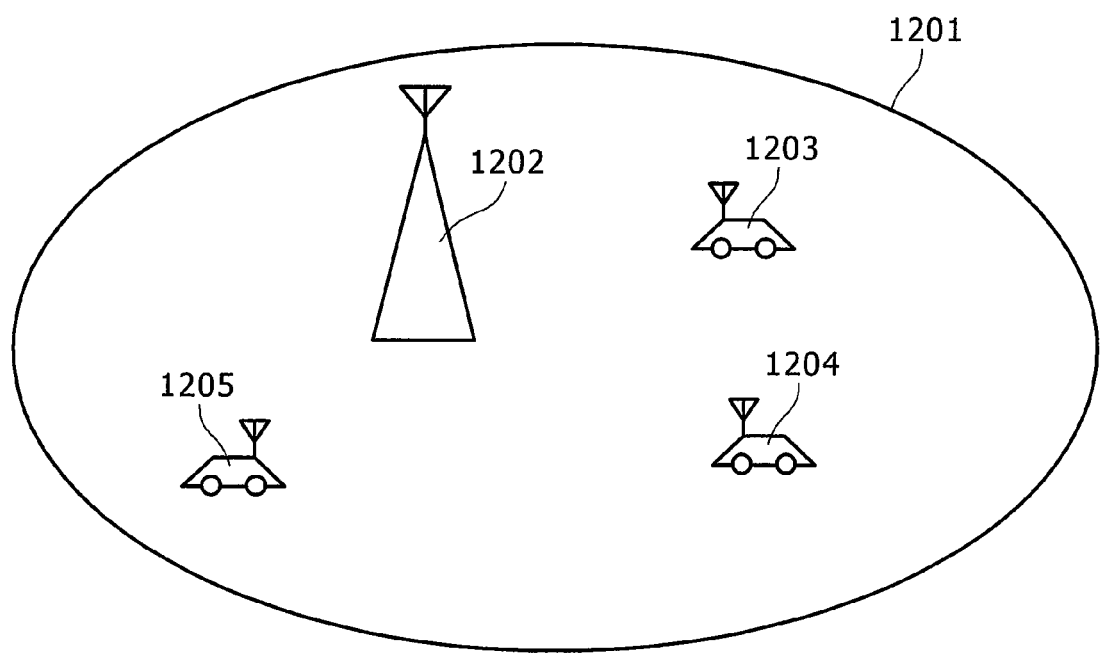
FIG. 12 is a diagram showing the configuration of an embodiment of the wireless communication system according to the present invention.

An embodiment of the wireless communication system according to the present invention will be described with reference to FIG. 12. FIG. 12 is a diagram showing the configuration of an embodiment of the wireless communication system according to the present invention. In FIG. 12, reference numeral 1201 denotes a communication area; 1202 a base station; and 1203 to 1205 mobile terminals. The base station 1202 and mobile terminals 1203 to 1205 are each equipped with a transmitter and a receiver (neither shown).

The example wireless communication system shown in FIG. 12 is for mobile communication services using, for example, cellular phones. The cellular phones used in a wireless communication system of the type shown in FIG. 12 are required to comply with, for example, the Long Term Evolution (LTE) standard defined by the 3rd Generation Partnership Project (3GPP).

Referring to FIG. 12, the base station 1202 and plural mobile terminals 1203 to 1205 are present in the communication area 1201. Voice and data are communicated between a transmitter, not shown (see FIG. 13 being described later), and a receiver (see FIG. 1) of the base station 1202 and transmitters and receivers (neither shown) of plural mobile terminals 1203 to 1205. Generally, a mobile terminal is equipped with a wireless device having transmission and reception functions. In the present embodiment, it is assumed that each mobile terminal is equipped with a transmitter and a receiver as discrete devices.

The mobile terminals 1203 to 1205 each have a transmitter and a receiver designed for use in a mobile vehicle, for example, an automobile. In the following description of the wireless communication system, the mobile terminal 1203 will be referred to as a representative mobile terminal unless there is a reason for not doing so.

In the wireless communication system shown in FIG. 12, communication is carried out between the transmitter of the base station 1202 and the receiver of the mobile terminal 1203 and between the transmitter of the mobile terminal 1203 and the receiver of the base station 1202 all existing in the communication area 1201. For communication between the mobile terminals 1203 and 1204, the base station 1202 serves as a relay station connecting the two mobile terminals.

Figure 13:
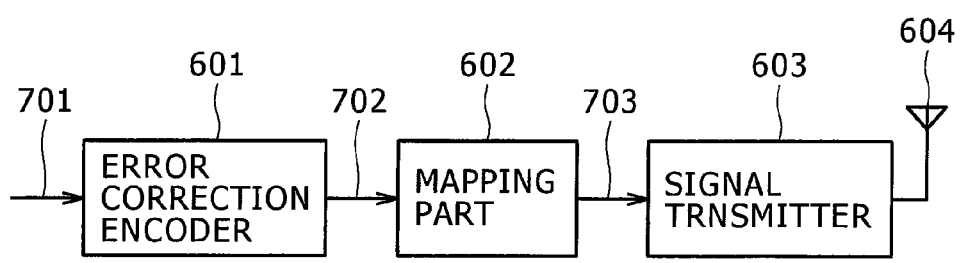
FIG. 13 is a block diagram showing the configuration of an embodiment of the transmitter for use in the wireless communication system according to the present invention.

FIG. 13 is a block diagram showing the configuration of an embodiment of the transmitter for use in a wireless communication system according to the present invention. In FIG. 13, reference numeral 601 denotes an error correction encoder; 602 a mapping part; 603 a signal transmitter; 604 an antenna; and 701 to 703 signal lines.

Referring to FIG. 13, data to be transmitted is inputted to the error correction encoder 601 via the signal line 701. The error correction encoder 601 encodes the inputted transmission data into a prescribed error correction code which may be a convolution code or a turbo code and outputs the encoded data to the mapping part 602 via the signal line 702. The mapping part 602 outputs the inputted data, after inserting prescribed pilot signals and carrying out mapping based on a prescribed mapping rule, to the signal transmitter 603 via the signal line 703. The signal transmitter 603 converts the inputted data into a radio signal and transmits it from the antenna 604 at a prescribed output level.

Embodiment 2

Figure 3:
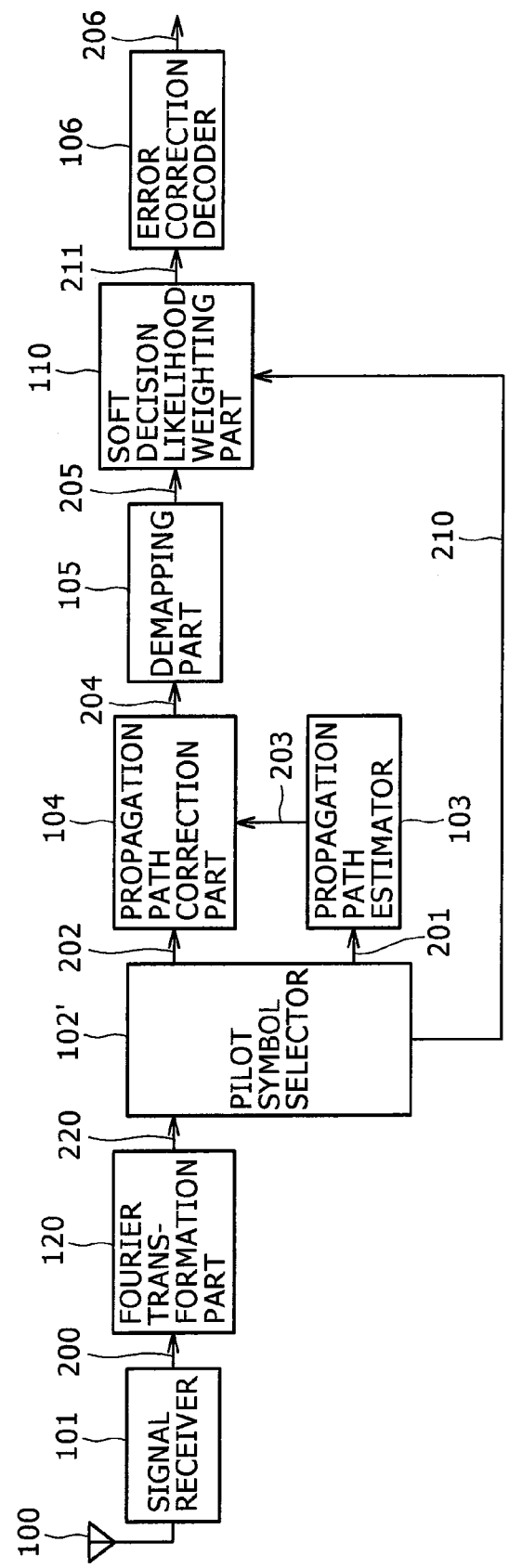
FIG. 3 is a block diagram showing the configuration of a second embodiment of the receiver according to the present invention.
Figure 4:
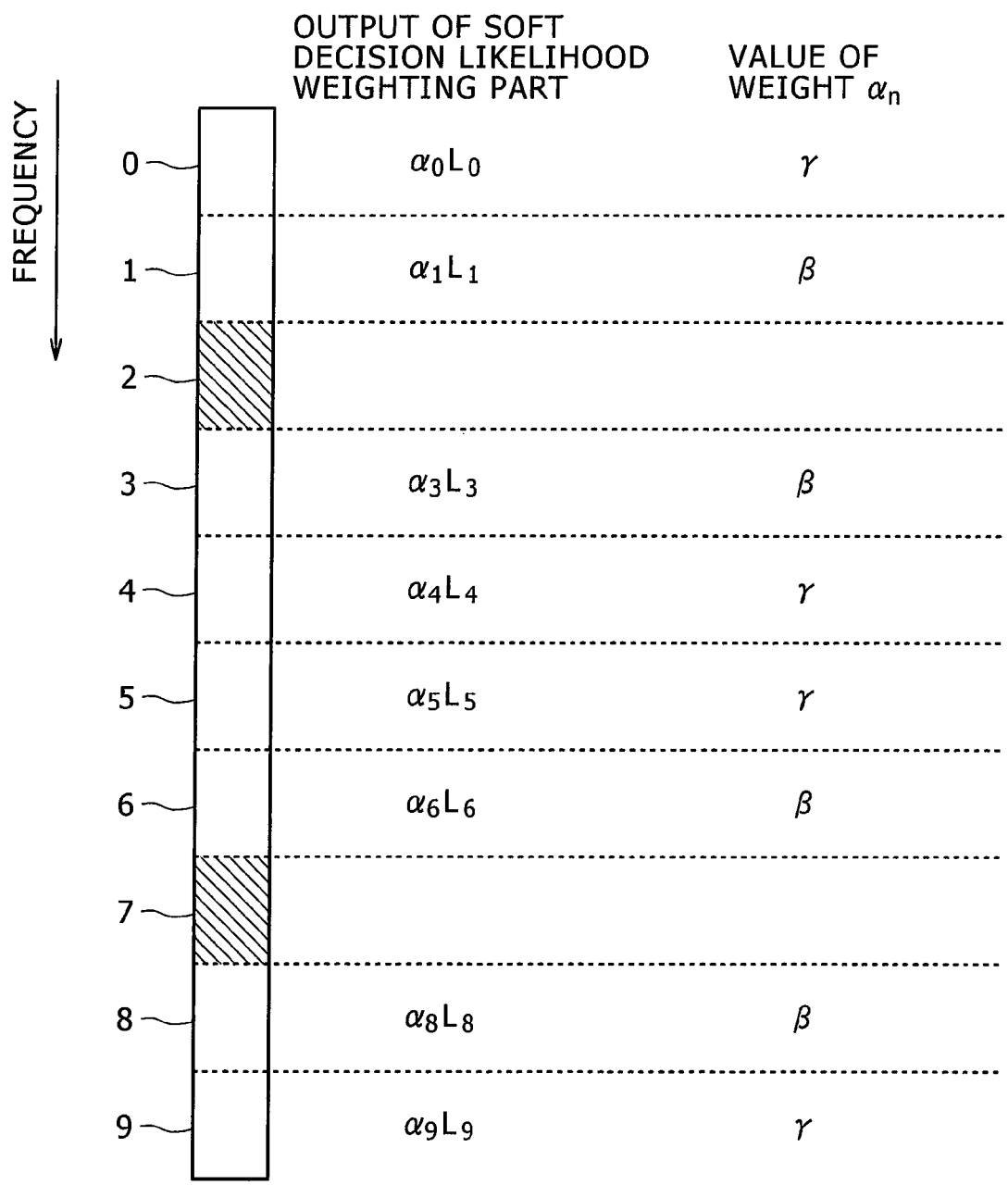
FIG. 4 is a diagram for explaining relationships between received symbols, propagation path estimation results, soft decision likelihoods, outputs of a soft decision likelihood weighting part, and weight values associated with the second embodiment of the present invention.

FIG. 3 is a block diagram showing the configuration of a second embodiment of the receiver according to the present invention. The configuration shown in FIG. 3 is almost identical with that of the first embodiment of the receiver shown in FIG. 1. Compared with the receiver whose configuration is shown in FIG. 1, the receiver whose configuration is shown in FIG. 3 has a Fourier transformation part 120 and a signal line 220 which are added between the signal receiver 101/the signal line 200 and the pilot symbol selector 102'. The example operation illustrated in FIG. 4 is based on a case where the present invention is applied to a communication system in which received symbols are frequency-division multiplexed. Among such communication systems is an Orthogonal Frequency Division Multiplexing (OFDM) system. In the case of the OFDM system, pilot symbols 2 and 7 and data symbols 0, 1, 3 to 6, 8 and 9 are, as shown in FIG. 4, frequency-division multiplexed. FIG. 4 is a diagram, like FIG. 2, for explaining relationships between received symbols, propagation path estimation results, soft decision likelihoods, outputs of the soft decision likelihood weighting part, and weight values associated with the second embodiment of the receiver according to the present invention. The second embodiment of the receiver shown in FIG. 3 obtains the received symbols 0 to 9 shown in FIG. 4 by processing, at the Fourier transformation part 120, a baseband signal generated at the signal receiver 101 for transformation from a time domain signal into a frequency domain signal. The received symbols thus obtained are inputted to the pilot symbol selector 120 via the signal line 220 to be then processed as in the first embodiment of the receiver.

In the second embodiment of the receiver, the soft decision likelihood weighting part 110 multiplies inputted soft decision likelihoods $L_0$ to $L_9$ (omitted in FIG. 4 for simplification) by corresponding weights $\alpha_0$ to $\alpha_9$, respectively, and outputs weighted soft decision likelihoods $\alpha_0 L_0$ to $\alpha_9 L_9$. The value of weight $\alpha n$ (n=0, 1, . . . , 9) is determined according to the difference in frequency between the corresponding data symbol and pilot symbol. The value of weight $\alpha_n$ is smaller when the difference in frequency between the corresponding data symbol and pilot symbol is larger.

In the example shown in FIG. 4, the weights corresponding to data symbols 1, 3, 6 and 8 which are adjacent to pilot symbol 2 or 7 are each represented by $\beta$, and the weights corresponding to other data symbols 0, 4, 5 and 9 are each represented by $\gamma$. Both $\beta$ and $\gamma$ assume non-negative values with $\beta$ being larger than $\gamma$, i.e. $\gamma < \beta$. Even though in the example shown in FIG. 4, only two weight values $\beta$ and $\gamma$ are used, three or more weight values may be used as also mentioned with reference to FIG. 2.

Embodiment 3

Figure 5:
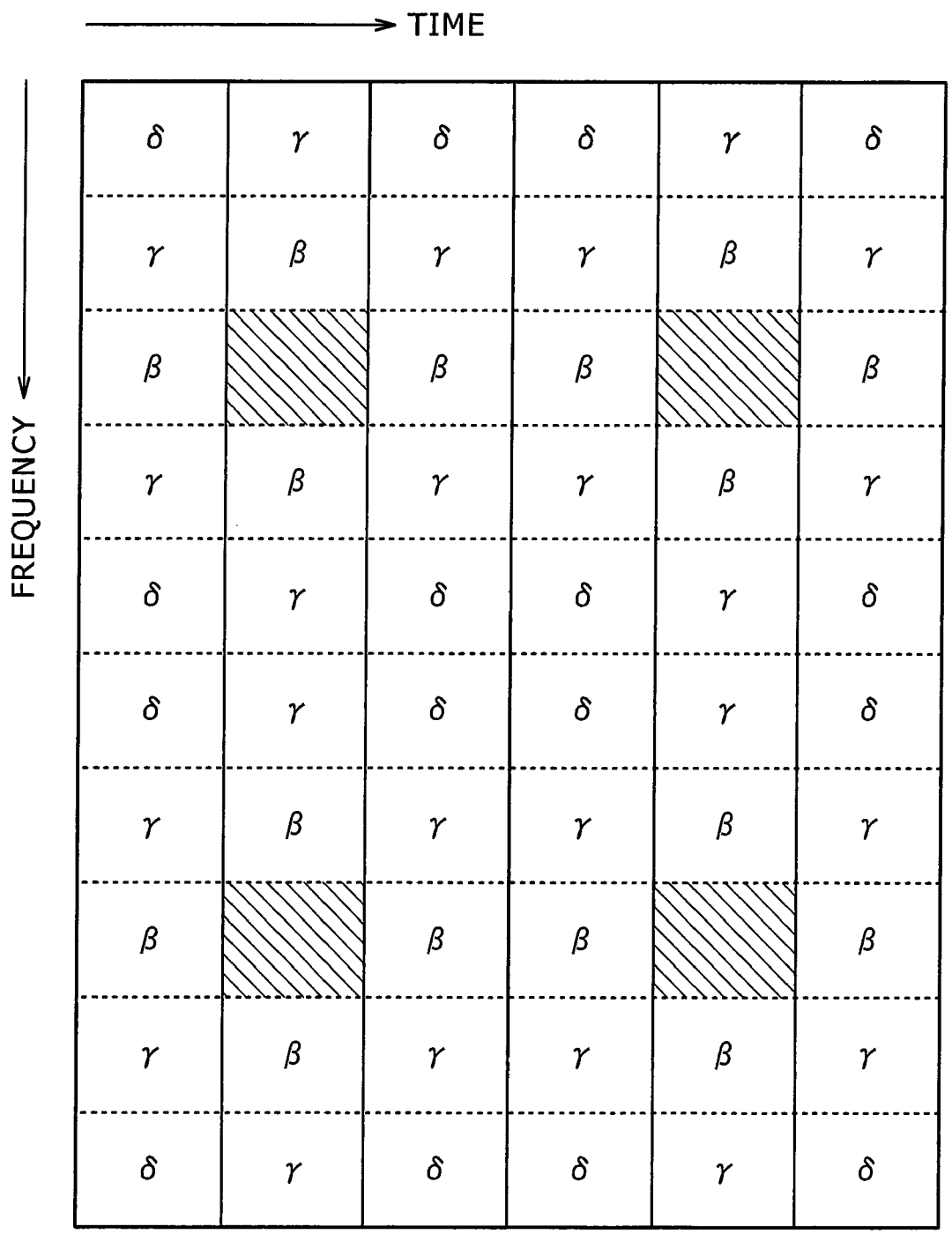
FIG. 5 is a diagram for explaining relationships between received symbols and weight values associated with a third embodiment of the present invention.

A third embodiment of the receiver according to the present invention will be described with reference to FIG. 5. The configuration of the third embodiment of the receiver is the same as that shown in FIG. 3 of the second embodiment of the receiver. When the OFDM system is used, received pilot symbols and data symbols are both frequency-division and time-division multiplexed, for example, as shown in FIG. 5. In FIG. 5, the received symbols shown hatched are pilot symbols, and the other symbols are data symbols. For graphic simplification, the symbols are not coded in FIG. 5.

When pilot symbols and data symbols are multiplexed as in the example shown in FIG. 5, the soft decision likelihood weighting part 110 of the third embodiment of the receiver multiplies the inputted soft decision likelihoods corresponding to received data symbols by corresponding weights, and outputs the weighted soft decision likelihoods (in FIG. 5, for graphic simplification, only weight values are indicated without any indication of unweighted or weighted soft decision likelihoods).

The values of weights are determined according to the differences in frequency and in time between corresponding data symbols and pilot symbols. A weight is smaller when the difference in frequency and in time between the corresponding data symbol and pilot symbol is larger.

In the example shown in FIG. 5, the weights corresponding to data symbols which are adjacent to a pilot symbol are each represented by $\beta$; the weights corresponding to data symbols which are adjacent to any of the data symbols given weight $\beta$ are each represented by $\gamma$; and the weights corresponding to the other data symbols are each represented by $\delta$. $\beta$, $\gamma$ and $\delta$ all assume non-negative values with $\beta$ being larger than $\gamma$, and $\gamma$ being larger than $\delta$, i.e. $\delta \leq \gamma \leq \beta$. The values of $\beta$, $\gamma$, and $\delta$ are dependent on communication system specifications and communication environment. In a general mobile communication environment, $\beta$ may be 1, $\gamma$ may be 0.5, and $\delta$ may be 0.3. Even though in the example shown in FIG. 5, three weight values $\beta$, $\gamma$, and $\delta$ are used, four or more weight values may be used. Also, in the example shown in FIG. 5, time divisions and frequency divisions are treated equally in terms of weighting, but they may be treated differently. For example, weighting may vary more sharply with time than with frequency, or vice versa.

The method of weighting explained with reference to FIG. 5 is applicable even when pilot symbols are not arranged as shown in FIG. 5, that is, they may be arranged in a different manner compatible with the OFDM system.

Embodiment 4

Figure 6:
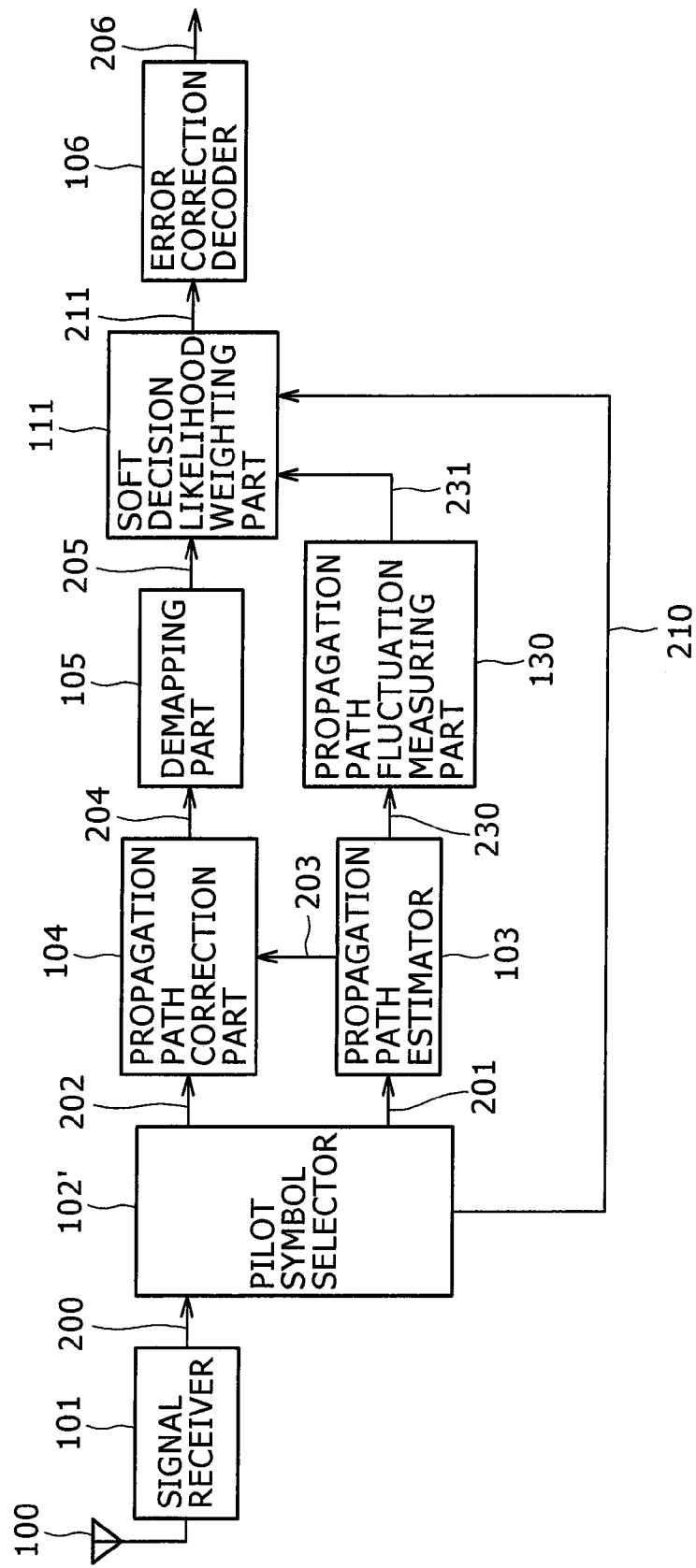
FIG. 6 is a block diagram showing the configuration of a fourth embodiment of the receiver according to the present invention.

FIG. 6 is a block diagram showing the configuration of a fourth embodiment of the receiver according to the present invention. With reference to FIG. 6, the propagation path estimator 103 outputs propagation path estimation results to the propagation path correction part 104 via the signal line 203 and also to a propagation path fluctuation measuring part 130 via a signal line 230. The propagation path fluctuation measuring part 130 calculates fluctuations with time of propagation path estimation results using inputted propagation path estimation results or a history of propagation path estimation results.

Figure 11:
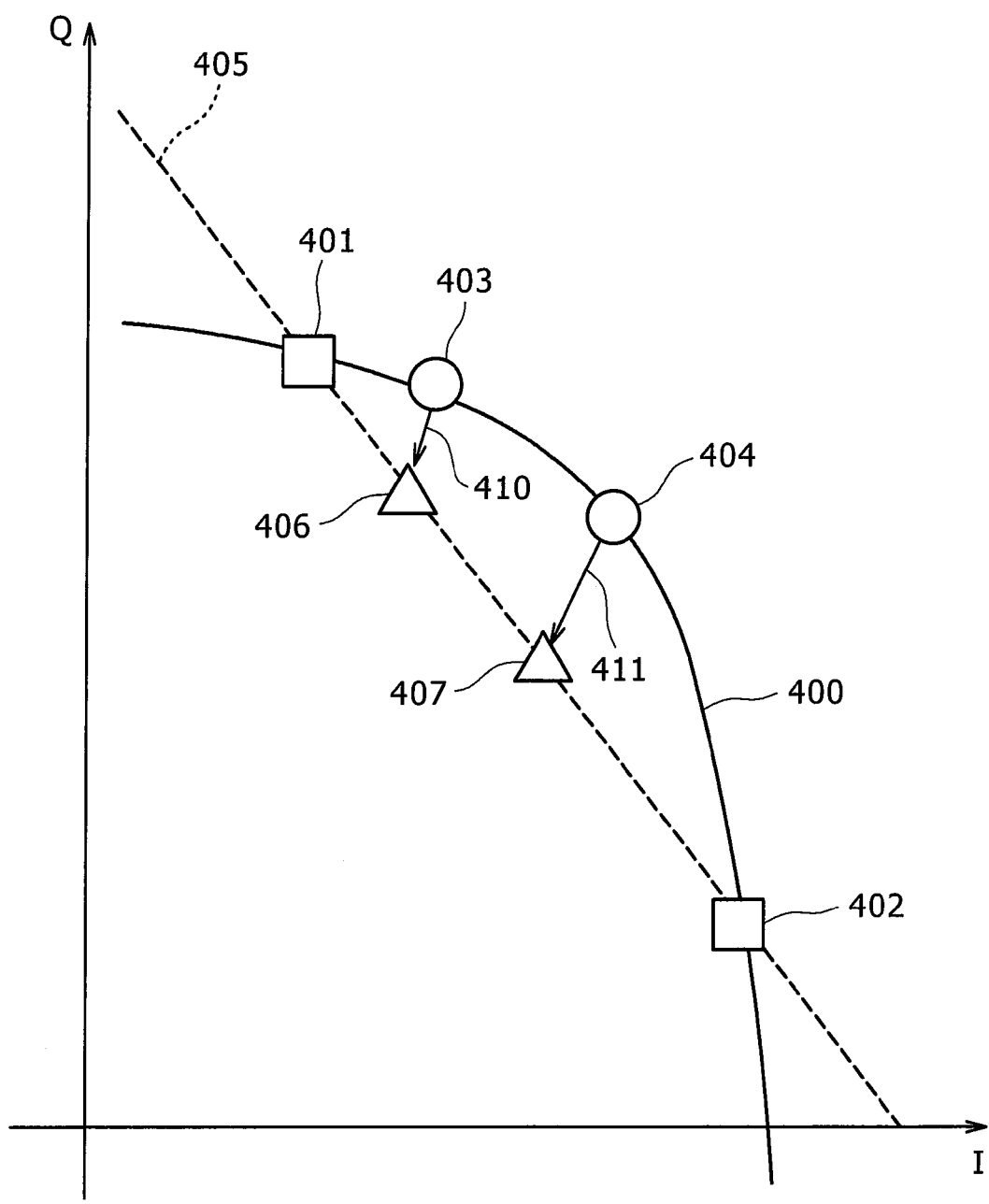
FIG. 11 is a diagram showing relationships between true and estimated propagation-path values on an I-Q plane.

Generally, propagation path estimation results are, as shown in FIG. 11, worked out as vector quantities on an I-Q plane. Propagation path estimation result fluctuations can, therefore, be represented as fluctuations of the amplitude and phase of propagation path estimation results (vector quantities) for pilot symbol portions. To be concrete, with reference to FIG. 9, fluctuations between propagation path estimation results $H_2$ and $H_7$ for pilot symbol portions, i.e. amplitude fluctuation $\Delta A$ and phase fluctuation $\Delta \theta$ between the propagation path estimation results can be calculated using equations (5) and (6), respectively.

$$\Delta A = ||H_7| - |H_2|| \quad (5)$$

$$\Delta \theta = |\angle H_7 - \angle H_2| \quad (6)$$

The propagation path fluctuation measuring part 130 outputs the propagation path fluctuation quantities calculated by the above method to the soft decision likelihood weighting part 111 via a signal line 231.

The soft decision likelihood weighting part 111 calculates weights corresponding to the inputted data symbols using the propagation path fluctuation quantities inputted from the propagation path fluctuation measuring part 130; multiplies the soft decision likelihood values corresponding to the data symbols by the corresponding calculated weights, respectively, and outputs the weighted soft decision likelihood values to the error correction decoder 106 via the signal line 211.

Figure 7:
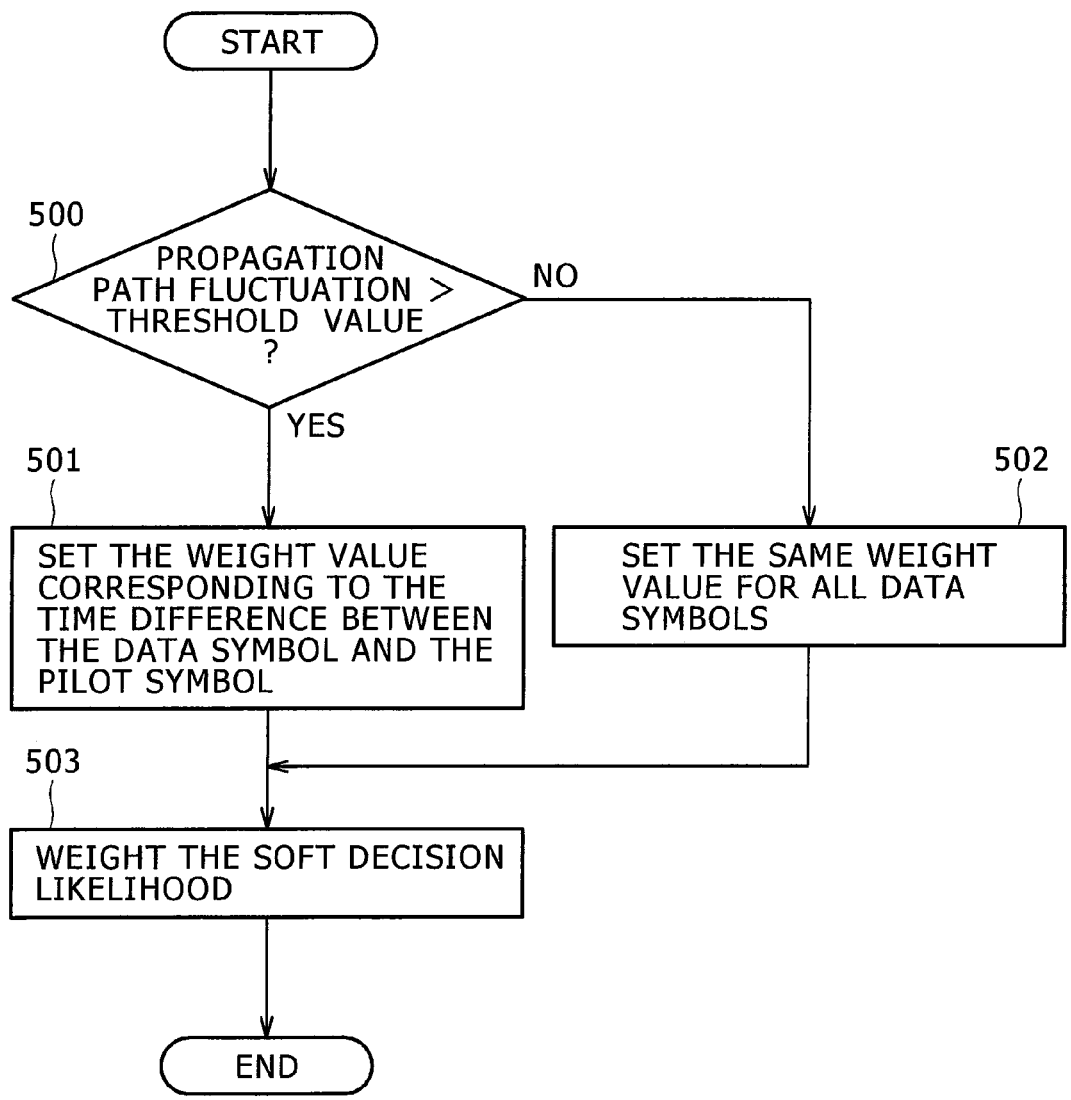
FIG. 7 is a flowchart for explaining an example operation of a soft decision likelihood weighting part according to the fourth embodiment of the present invention.

FIG. 7 shows an example method which may be used by the soft decision likelihood weighting part 111 to calculate a weight according to a propagation path fluctuation quantity. First, in step 500, the soft decision likelihood weighting part 111 determines whether an inputted propagation path fluctuation quantity is larger than a predetermined threshold value. The propagation path fluctuation quantity to be checked may be either an amplitude fluctuation quantity calculated using equation (5) or a phase fluctuation quantity calculated using equation (6).

When the propagation path fluctuation quantity is larger than the threshold value, the soft decision likelihood weighting part 111 calculates and sets, for each data symbol, a weight according to the time difference between the data symbol and corresponding pilot symbol in step 501. The weight may be calculated by the method described with reference to FIG. 2 for the first embodiment.

When, in step 500, the propagation path fluctuation quantity is determined not larger than the threshold value, the soft decision likelihood weighting part 111 sets a same weight for each data symbol in step 502.

In step 503, the soft decision likelihood weighting part 11 multiplies the soft decision likelihood value corresponding to each data symbol by the corresponding weight set in step 501 or 502 and thereby obtains a weighted soft decision likelihood value.

The soft decision likelihood weighting part 111 inputs the soft decision likelihood value thus weighted to the error correction decoder 106 via the signal line 211. The error correction decoder 106 operates in the same manner as in the existing type of receiver shown in FIG. 8.

The fourth embodiment has been explained based on an example case in which, as in the first embodiment, data symbols and pilot symbols are only time-division multiplexed. However, even in cases where data symbols and pilot symbols are only frequency-division multiplexed as shown in FIG. 4 for the second embodiment or both time-division and frequency-division multiplexed as shown in FIG. 5 for the third embodiment, it is possible to implement the fourth embodiment in combination with the second or third embodiment.

Referring to FIG. 7 for the fourth embodiment, the soft decision likelihood weighting part 111 can selectively perform one of the two steps depending on the result of comparison between a propagation path fluctuation quantity and a threshold value, but the propagation path fluctuation quantity may be compared with more than one threshold value, for example, as many as N threshold values thereby allowing the soft decision likelihood weighting part 111 to selectively perform one of as many as (N+1) steps. For weight calculation, a function which continuously varies according to the propagation path fluctuation quantity may also be used.

According to the first to fourth embodiments described above, the error rate characteristic of wireless communication can be improved, particularly, for a mobile terminal moving at high speed or in a multi-path environment with large delay spread.

The magnitude of the error rate characteristic improvement achievable according to the present invention depends on, for example, communication system specifications and communication environment. In a general mobile communication environment, it may be possible to improve the packet error rate characteristic by 0.1 to 0.4 dB.

The present invention concerns the configuration of a receiver, so that it can be easily applied to a wireless communication system using an already established communication method.

The present invention concerns the configuration of a receiver, so that it can be implemented in combination with existing techniques like the one disclosed in JP-A No. 2007-135021 concerning the transmission processing based on a communication method.

According to the present invention, the error rate characteristic can be improved for a receiver of a mobile terminal for receiving signals transmitted, by a wireless communication method using an error correction code, from a transmitter of a base station.

What is claimed is:

1. A wireless communication system for communicating a radio signal, the system including a transmitter for transmitting a radio signal and a receiver for receiving the radio signal, wherein the transmitter comprises a signal transmitter for transmitting a radio signal to the receiver, and wherein the receiver comprises:

a signal receiver for receiving a radio signal and processing the radio signal into a received signal;

a pilot signal selector for separating a pilot signal from the received signal;

a propagation path estimation part for estimating information on a radio signal propagation path using the pilot signal selected by the pilot signal selector;

a propagation path correction part for correcting an effect of the propagation path using the propagation path information estimated by the propagation path estimation part, the effect being contained in the received signal;

a demapping part for calculating a soft decision likelihood value by comparing the received signal having had the effect thereon of the propagation path corrected at the propagation path correction part and a reference signal, the soft decision likelihood value representing correctness, estimated from the received signal having had the effect thereon of the propagation path corrected, of the signal transmitted from the signal transmitter;

a soft decision likelihood weighting part for calculating a weight according to a relationship between the pilot signal and the received signal and multiplying the soft decision likelihood value corresponding to the received signal by the weight; and an error correction decoder for performing error correction decoding using the soft decision likelihood value multiplied by the weight.

2. The wireless communication system according to claim 1, further comprising a propagation path fluctuation measuring part for calculating, using the estimated propagation path information, a quantity of fluctuation of the propagation path information:

wherein the soft decision likelihood weighting part calculates a weight according to a relationship between the pilot signal and the received signal and the quantity of fluctuation of the propagation path information, and multiplies the soft decision likelihood value corresponding to the received signal by the weight; and wherein the error correction decoder performs error correction decoding using the soft decision likelihood value multiplied by the weight.

3. A receiver comprising:

a signal receiver for receiving a radio signal and processing the radio signal into a received signal;

a pilot signal selector for separating a pilot signal from the received signal;

a propagation path estimation part for estimating information on a radio signal propagation path using the pilot signal selected by the pilot signal selector;

a propagation path correction part for correcting an effect of the propagation path using the propagation path information estimated by the propagation path estimation part, the effect being contained in the received signal;

a demapping part for calculating a soft decision likelihood value by comparing the received signal having had the effect thereon of the propagation path corrected at the propagation path correction part and a reference signal, the soft decision likelihood value representing correctness, estimated from the received signal having had the effect thereon of the propagation path corrected, of the signal transmitted from the signal transmitter;

a soft decision likelihood weighting part for calculating a weight according to a relationship between the pilot signal and the received signal and multiplying the soft decision likelihood value corresponding to the received signal by the weight; and an error correction decoder for performing error correction decoding using the soft decision likelihood value multiplied by the weight.

4. The receiver according to claim 3, further comprising a propagation path fluctuation measuring part for calculating, using the estimated propagation path information, a quantity of fluctuation of the propagation path information:

wherein the soft decision likelihood weighting part calculates a weight according to a relationship between the pilot signal and the received signal and the quantity of fluctuation of the propagation path information, and multiplies the soft decision likelihood value corresponding to the received signal by the weight; and wherein the error correction decoder performs error correction decoding using the soft decision likelihood value multiplied by the weight.

5. The receiver according to claim 3, wherein the soft decision likelihood weighting part calculates the weight according to a difference in time between the pilot signal and the received signal.

6. The receiver according to claim 5, wherein the soft decision likelihood weighting part makes the weight corresponding to the received signal smaller when the difference in time between the pilot signal and the received signal is larger.

7. The receiver according to claim 3, wherein the soft decision likelihood weighting part calculates the weight according to a difference in frequency between the pilot signal and the received signal.

8. The receiver according to claim 7, wherein the soft decision likelihood weighting part makes the weight corresponding to the received signal smaller when the difference in frequency between the pilot signal and the received signal is larger.

9. The receiver according to claim 4, wherein the soft decision likelihood weighting part makes the difference between the weight and another weight larger when the quantity of fluctuation of the propagation path information is larger and makes the difference smaller when the quantity of fluctuation is smaller.

10. A method of processing a received signal, comprising:

receiving a radio signal and processing the radio signal into a received signal;

separating a pilot signal from the received signal and estimating information on a radio signal propagation path using the separated pilot signal;

correcting an effect of the propagation path using the estimated propagation path information, the effect being contained in the received signal;

calculating a soft decision likelihood value by comparing the received signal having had the effect thereon of the propagation path corrected and a reference signal, the soft decision likelihood value representing correctness, estimated from the received signal having had the effect thereon of the propagation path corrected, of the signal transmitted from the signal transmitter;

calculating a weight according to a relationship between the pilot signal and the received signal;

multiplying the soft decision likelihood value corresponding to the received signal by the weight; and performing error correction decoding using the soft decision likelihood value multiplied by the weight.

11. The method of processing a received signal according to claim 10, further comprising:

calculating, using the estimated propagation path information, a quantity of fluctuation of the propagation path information;
calculating a weight according to a relationship between the pilot signal and the received signal and the quantity of fluctuation of the propagation path information;

multiplying the soft decision likelihood value corresponding to the received signal by the weight; and
performing error correction decoding using the soft decision likelihood value multiplied by the weight.

* * * * *